US008563928B2

(12) United States Patent
Falk

(10) Patent No.: US 8,563,928 B2
(45) Date of Patent: Oct. 22, 2013

(54) LASER THERMAL IMAGING

(75) Inventor: Robert Aaron Falk, Newcastle, WA (US)

(73) Assignee: Quantum Focus Instruments Corporation, Vista, CA (US)

( * ) Notice: Subject to any disclaimer, the term of this patent is extended or adjusted under 35 U.S.C. 154(b) by 219 days.

(21) Appl. No.: 12/913,679

(22) Filed: Oct. 27, 2010

(65) Prior Publication Data

US 2011/0095186 A1 Apr. 28, 2011

Related U.S. Application Data

(60) Provisional application No. 61/255,414, filed on Oct. 27, 2009, provisional application No. 61/305,354, filed on Feb. 17, 2010.

(51) Int. Cl.
*G02F 1/01* (2006.01)
(52) U.S. Cl.
USPC .......................................................... 250/330
(58) Field of Classification Search
USPC .......................................................... 250/330
See application file for complete search history.

(56) References Cited

U.S. PATENT DOCUMENTS

| 5,754,298 | A  | * | 5/1998  | Falk       | 356/390 |
|-----------|----|---|---------|------------|---------|
| 6,181,416 | B1 | * | 1/2001  | Falk       | 356/129 |
| 8,209,767 | B1 | * | 6/2012  | Manassen   | 850/30  |
| 2010/0302625 | A1 | * | 12/2010 | Li et al. | 359/319 |

OTHER PUBLICATIONS

Dyba et al., Focal Spots of Size lamda/23 Open Up Far-Field Florescence Microscopy at 33 nm Axial Resolution, Apr. 22, 2002, Physical Review Letters, vol. 88, pp. 1-4.*
Hartschuh et al., Tip-enhanced optical spectroscopy, Feb. 13, 2004, Royal Society, vol., 262, pp. 807-819.*
Wong et. al., Sub-Wavelength Focusing at the Multi-Wavelength Range Using Superoscillations: An Experimental Demonstration, Dec. 2011, vol. 59, IEEE Transactions on Antennas and Propagation, pp. 4766-4776.*
Lewis et al., Failure Analysis of Integrated Circuits Beyond the Diffraction Limit: Contact Mode Near-Field Scanning Optical Microscopy with Integrated Resistance, Capacitance, and UV Confocal Imaging, September 2000, Proceedings of the IEEE, vol. 88, No. 9, 1471-1479.*
Lee et al., Sub-diffraction-limit imaging based on the topographic contrast of differential confocal microscopy, Oct. 1, 2003, Optic Letters, vol. 28, pp. 1772-1774.*
Fang et al., Sub-Diffraction-Limited Optical Imaging with a Silver Superlens, Apr. 22, 2005, Science, vol. 308, pp. 534-537.*

* cited by examiner

*Primary Examiner* — Christine Sung
(74) *Attorney, Agent, or Firm* — Lowe Graham Jones PLLC

(57) ABSTRACT

Methods and apparatus for producing sub-diffraction limited images utilizing an exponential scaling effect. An exemplary system provides an optical source that focuses an optical beam onto a target. The focused optical beam has sufficient optical intensity to induce an exponential signal response within the target. A detection device detects the exponential signal response. A scanning device scans the focused optical source and another device records the detection of the exponential signal response for purposes of producing a sub-diffraction limited image. The system further includes a display device that displays at least a portion of the recorded detection.

19 Claims, 6 Drawing Sheets

LASER THERMAL IMAGING

PRIORITY CLAIM

This application clams priority to provisional patent application 61/255,414 filed on Oct. 27, 2009 and 61/305,354 filed on Feb. 17, 2010 and are incorporated herein by reference.

FIELD OF THE INVENTION

This invention relates generally to producing sub-diffraction limited imaging utilizing non-linear exponential scaling of laser-induced thermal radiation.

BACKGROUND OF THE INVENTION

Improvement in image resolution with non-linear signal response has been investigated through the square law power scaling of two-photon absorption in biological [W. Denk, J. Strickler, W. Webb, Science 10248 (1990) 73-76] and IC applications [E. Ramsay, D. T. Reid, Optics Communications 10221 (2003) 10427-433]. The square power dependence of the two-photon signal narrows the image point response by square root of two. Image resolution is improved over the diffraction limit by the same factor.

Two-photon absorption in silicon is produced using a near IR wavelength pulsed laser (1275 nm). The peak pulse power is sufficiently high to observe second order absorption of two photons at once. The combined energy is equivalent to a single photon at 10637.5 nm, well above that silicon bandgap energy. The resultant photo-carriers are collected as the laser is scanned. Recent efforts have demonstrated both increased transverse and axial resolution. This combination has produced dramatic 3-D images of the junction areas of various devices [V. Pouget, et al., 35th ISTFA, (2009) 10268-71].

Even higher peak laser powers can induce absorption of three photons, four photons, and so on. The related image resolution would improve as square root of the number of photons absorbed for each created photo-carrier. However, the required laser powers become somewhat problematic from a practical standpoint.

SUMMARY OF THE INVENTION

The current invention provides methods and apparatus for producing sub-diffraction limited images utilizing this exponential scaling effect.

An exemplary system provides an optical source that focuses an optical beam onto a target. The focused optical beam has sufficient optical intensity to induce an exponential signal response within the target. A detection device detects the exponential signal response. A scanning device scans the focused optical source and another device records the detection of the exponential signal response for purposes of producing a sub-diffraction limited image.

In one aspect of the invention, the system further includes a display device that displays at least a portion of the recorded detection.

In another aspect of the invention, the optical source is a laser.

In still another aspect of the invention, the exponential signal response within the target is thermal radiation or a semiconductor device leakage current.

In yet another aspect of the invention, the scanning device is a laser scanning or confocal type microscope.

BRIEF DESCRIPTION OF THE DRAWINGS

Preferred and alternative examples of the present invention are described in detail below with reference to the following drawings.

DETAILED DESCRIPTION OF THE PREFERRED EMBODIMENT

Figure 1:
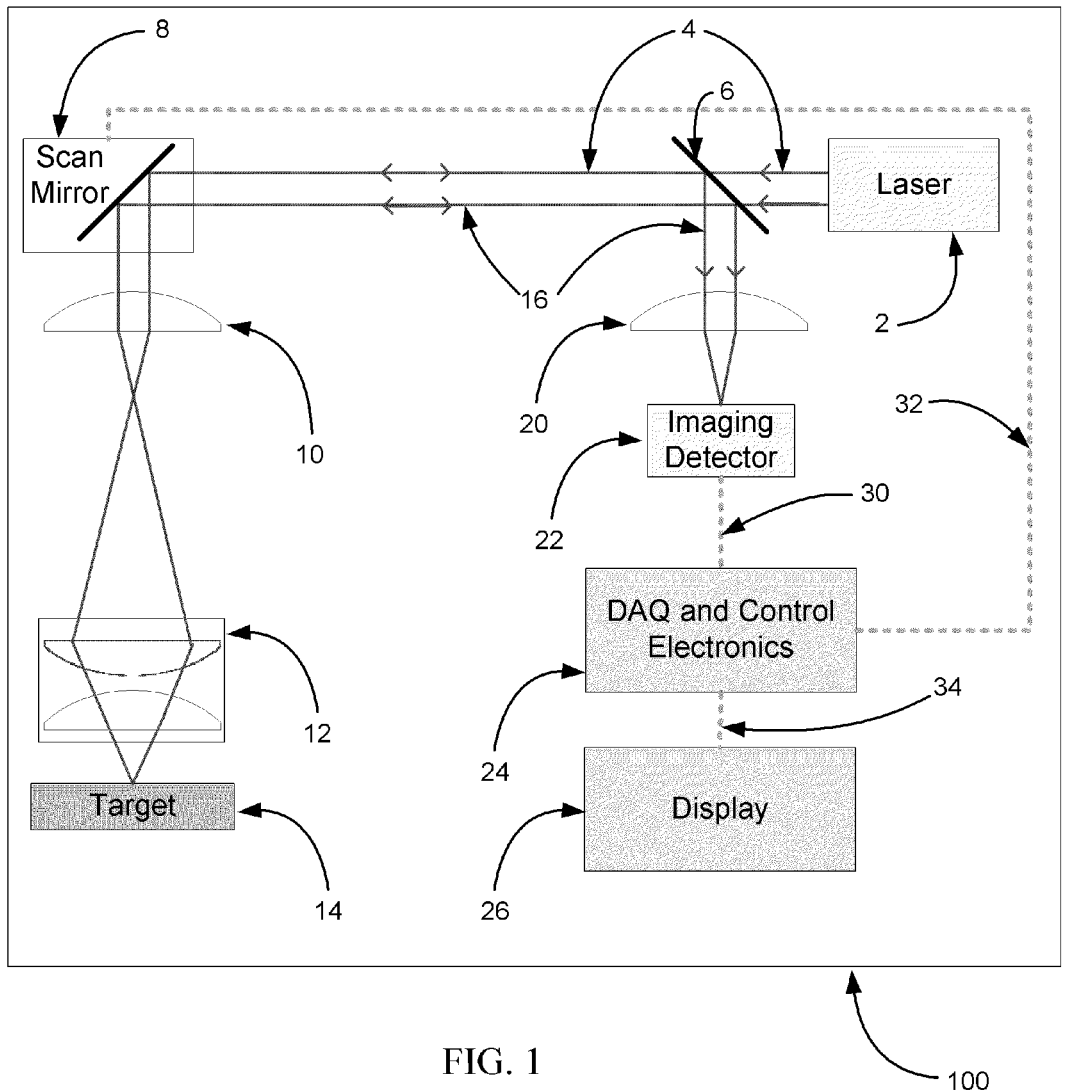
FIG. 1 is a laser scanning microscope (LSM) formed in accordance with the prior art.

FIG. 1 shows a laser scanning microscope (LSM) 100 formed in accordance with the prior art. LSMs are a form of confocal microscope. The following short description of LSM 100 is meant as a framework for understanding the current invention, not as a complete reference on the apparatus.

LSM 100 includes a laser source 102, which emits an optical beam 104 that is initially collimated. The collimated optical beam 104 passes through a beam splitter 106 on its way to a scanner assembly 108. The scanner assembly 108 scans the optical beam 104 in angle along both directions transverse to the path of the optical beam 104 as it exits the scanner assembly 108. A first lens 110 serves to both focus the optical beam 104 and to act as a field lens. An optical objective 112 focuses the optical beam 104 onto a target 114 in such a manner as to focus the optical beam 104 on the target 114 and to cause transverse angular deviations in the optical beam 104 induced by the scanner assembly 108 to be transformed into transverse spatial deviations on the target 114.

Some portion of the optical beam 104 striking the target 114 will be reflected back (as an optical beam 116) through the optical components described above until it strikes the beam splitter 106 where some of the returning optical beam 116 will be deviated towards a second lens 120. The second lens 120 focuses the returning optical beam 116 onto an imaging detector 122 which produces an electrical detection signal 130 that is in turn passed to data acquisition and control (DAQC) electronics 124. There are many known forms for the DAQC electronics 124; however, the basic functionality is to record the detection signal 130 as the scanner assembly 108 is directed to scan based on a scan control line (signal) 132. A raster scan is typically used for the scan control line 132. The recorded signal can then be sent to a video display 126 via a display line 134. In this fashion the variations in the amount of the optical beam 104 reflected by the target 114 will appear as an image to a user of the LSM 100.

Figure 2:
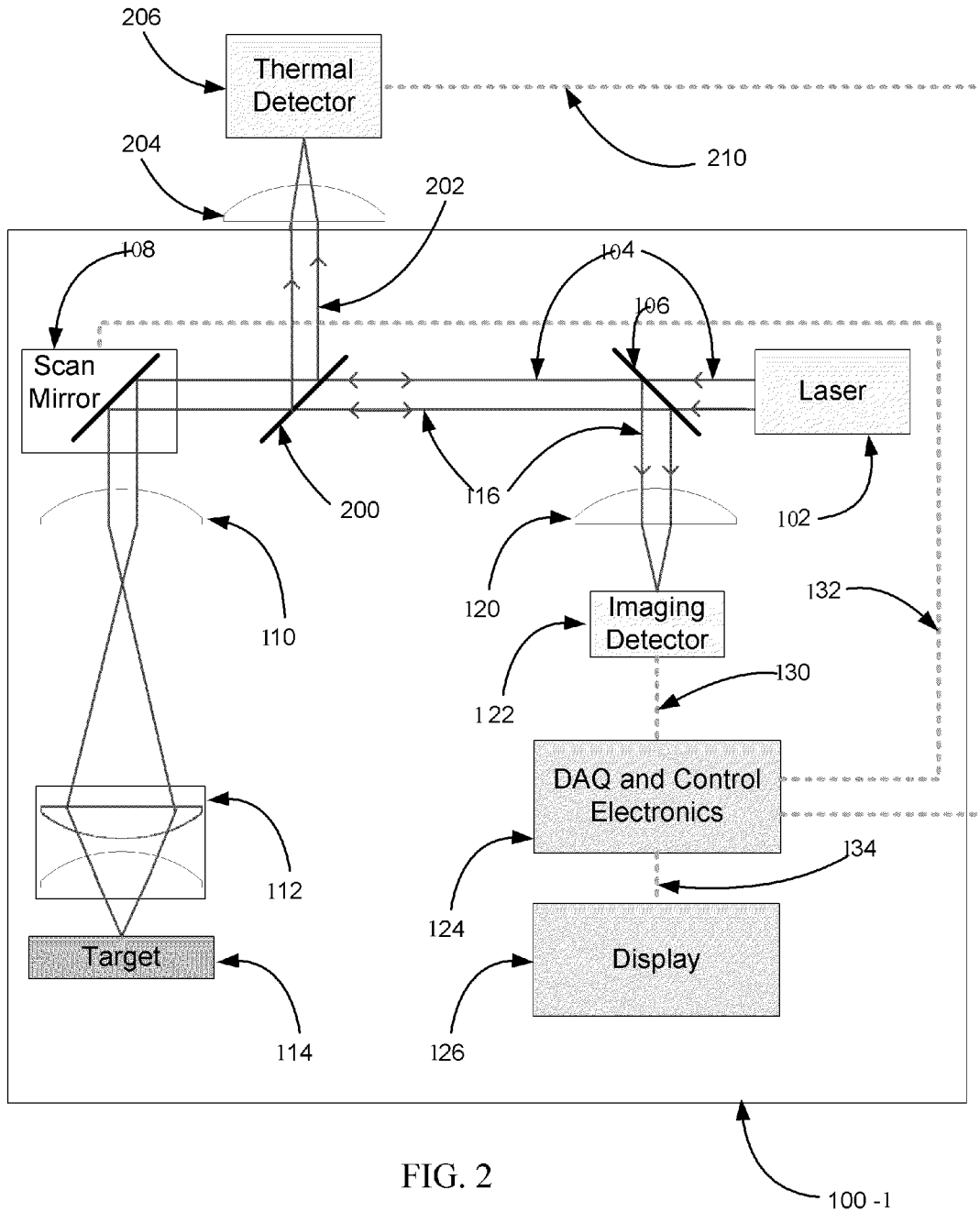
FIG. 2 is an LSM formed in accordance with an embodiment of the present invention.

In one embodiment of the current invention as shown in FIG. 2, an LSM 100-1 provides sub-diffraction limited imaging. In this instance, the laser source 102 is assumed to be of sufficient optical power to significantly raise the temperature of the target 114 at the focal spot of the optical beam 104. The LSM 100-1 includes a color beam splitter 200 which diverts some of the returning optical beam 116 into a thermal optical beam 202 while allowing a significant portion of the returning optical beam 116 (as well as the optical beam 104) to pass through without reflection. In operation the wavelength of the laser source 102 is chosen to be short compared to typical thermal radiation. In one non-limiting example, the laser wavelength of the optical beam is 532 nanometers produced by a double YAG laser. The color beam splitter 200 then transmits the 532 wavelength optical beam and reflects longer wavelengths.

The thermal optical beam 202 passes through a third lens 204 that focuses onto a thermal detector 206. If the target 114 is made sufficiently hot by the laser source 102, i.e., in the range of 200 C and above, an InGaAs detector is used as the thermal detector 206. The InGaAs detector has a typical wavelength response of approximately 1.0 to 1.7 micron. Lesser heating requires detection at longer wavelengths in order to produce sufficient response by the thermal detector 206. InSb detectors work in the 102 to 106 micron range. HgCdTe detectors detect out to 112 micron. Several other options for the thermal detector 206 based on target temperature will be obvious to those versed in the art of thermal detectors.

The thermal detector 206 produces an electrical thermal detection signal 210 which sent to the DAQC electronics 124. The DAQC electronics 124 process the electrical thermal detection signal 210 in a fashion similar to the detection signal 130 so as to produce an image on display 126 of the variations in the electrical thermal detection signal 210.

An image of the electrical thermal detection signal 210 provides some general interest for thermal analysis of the target 114. However, a primary interest for the current invention is the ability to produce sub-diffraction limited images. The optical intensity of the laser spot focused on the target 114 is not uniform, but falls off in a Gaussian or Airy pattern (dependent on the exact details of the optics of the LSM 100-1) in directions transverse to the central axis of the optical beam 104. This fall off is referred to as the optical spot size of the optical beam 104 on the target 114 and is limited by diffraction. A perfect imaging system is said to have diffraction limited resolution as defined by a fraction of this spot size, e.g. the Rayleigh criteria.

The temperature rise induced by the laser 102 is proportional to said optical intensity. However, the thermal radiation induced by the temperature rise depends exponentially on said temperature. Thus, halving the temperature rise can reduce the induced thermal radiation by a factor of 10 or more. Thus the spot size of the thermal radiation induced by the laser heating will be narrower than the diffraction spot size, allowing sub-diffraction limited imaging using the electrical thermal detection signal 210.

Figure 3:
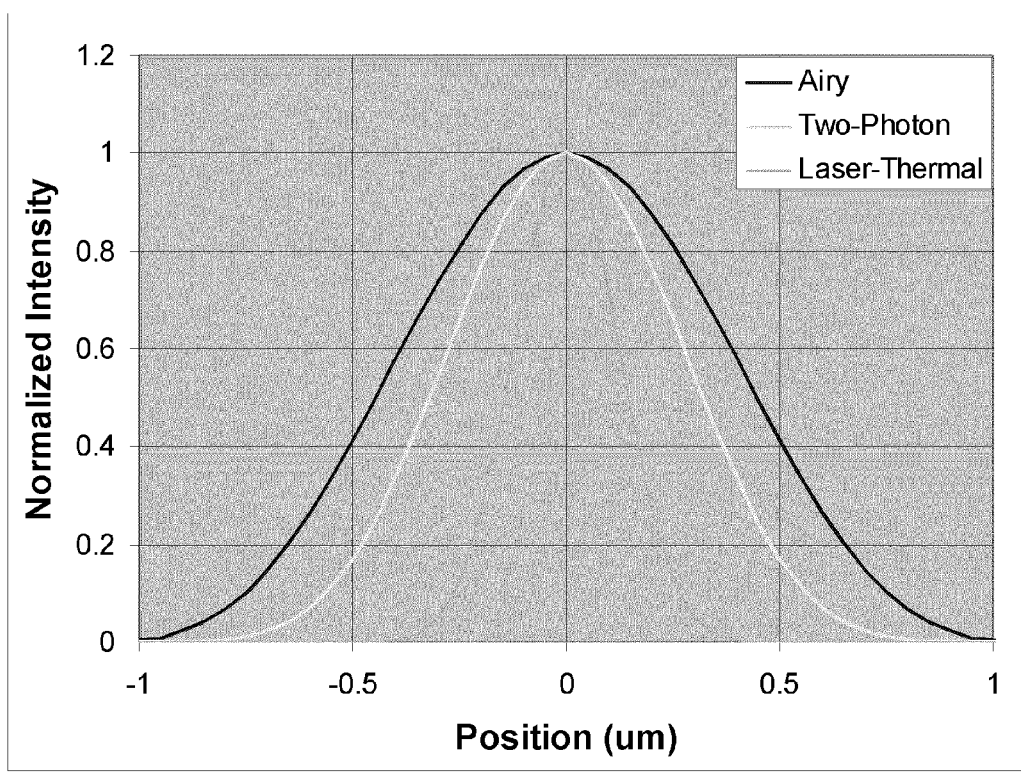
FIG. 3 illustrates predicted result of the present invention compared to prior art results.

FIG. 3 shows a theoretical spot size of electrical thermal detection signal 210 (indicated as Laser-Thermal) in comparison to the Airy spot size for a typical high numerical aperture objective and a Two-Photon signal. A factor of three reduction in spot size, relating to a remarkable factor of three improvement in image resolution over the diffraction limit is predicted. The Two-Photon signal is the spot size related to the techniques described by Ramsay and Pouget.

Figure 4:
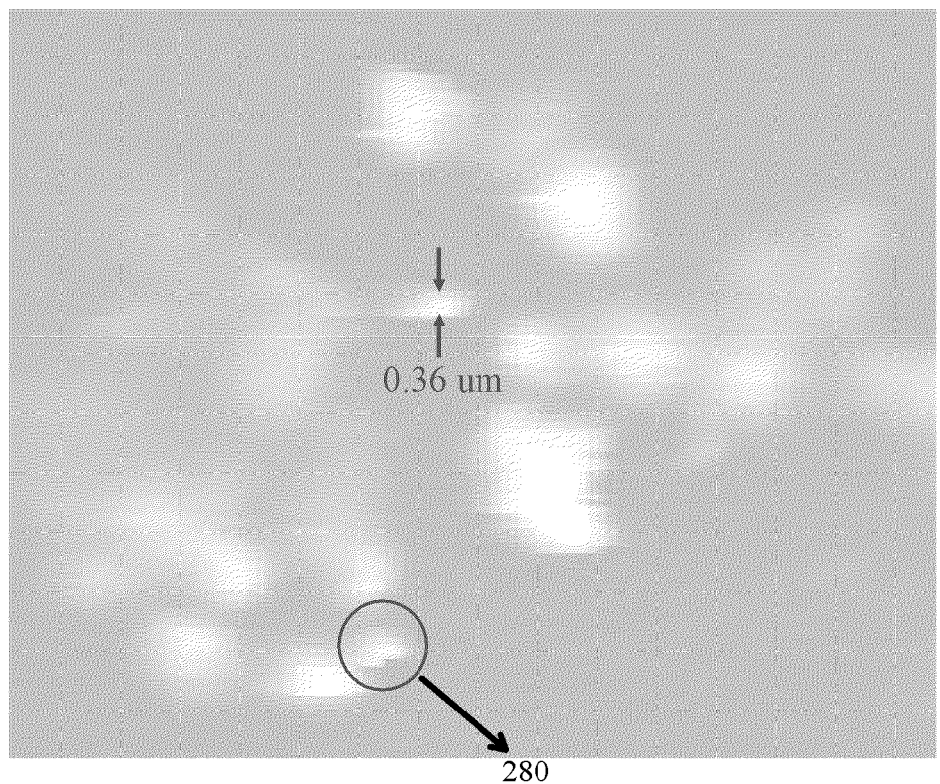
FIG. 4 shows experimental resulting image produced by the present invention.

FIG. 4 shows an experimental result of the predicted image improvement. Spots as small as 0.36 micron are clearly seen—much smaller than the ~1 micron laser spot size indicated in circle 280.

Figure 5:
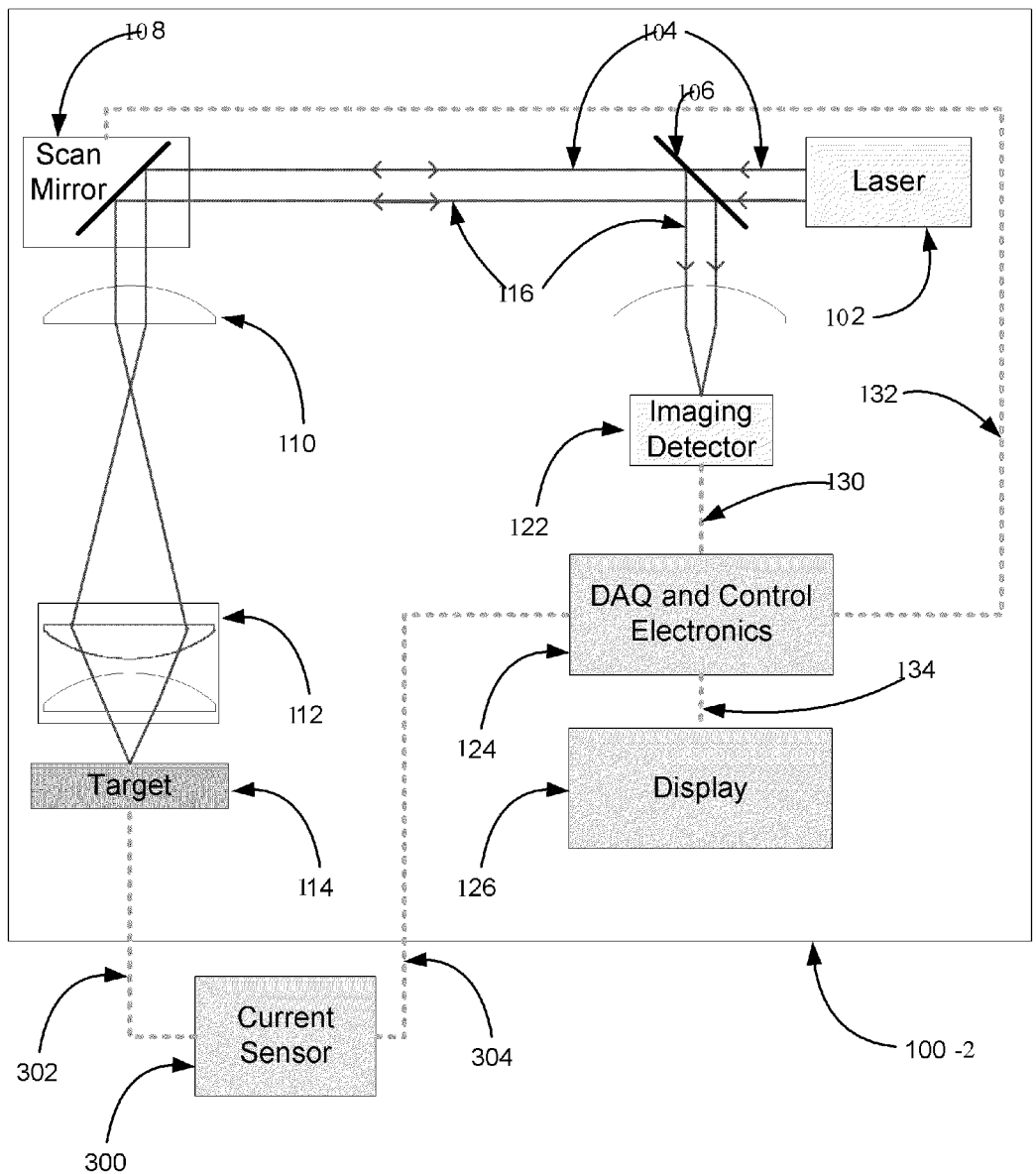
FIG. 5 is an LSM formed in accordance with an alternate embodiment of the present invention.

A second embodiment of an LSM 100-2 is shown in FIG. 5. In this embodiment, the target 114 is an integrated circuit. Contained within a typical integrated circuit are a number of junctions whose leakage current varies exponentially with temperature. This leakage current is monitored with a current sensor 300 (of which there are many forms) attached to the integrated circuit (the target 114) via current sensing lines 302 in such a way to produce a current sense signal 304. The current sense signal 304 is passed to the DAQC electronics 124 and displayed as an image in a fashion similar to the two prior signals 130 and 210. Due to the exponential response of leakage current with heating, the resultant leakage current image will also be sub-diffraction limited.

Figure 6A:
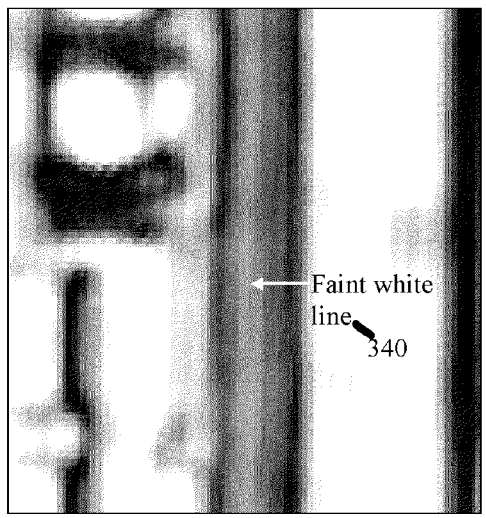
FIGS. 6a, b show prior art and present invention image results of the same circuit component.
Figure 6B:
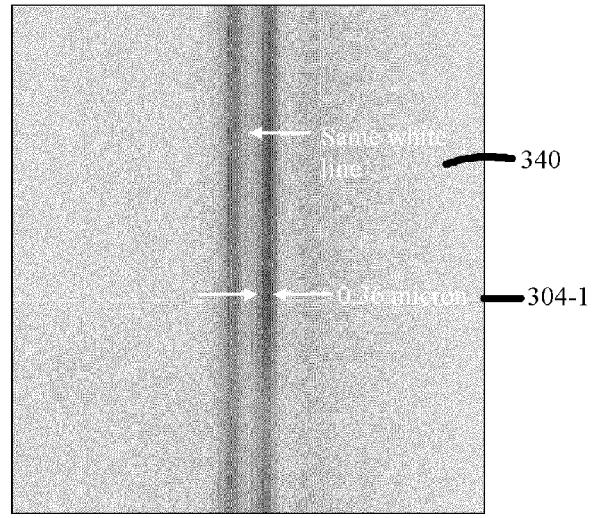

An experimental example is shown in FIGS. 6a,b. The image in FIG. 6(a) is derived from the electrical detection signal 130 of the reflected optical beam 104 and the image in FIG. 6(b) is derived from the current sense signal 304. A white line 340 in the images is part of a diode structure with a p-n junction. The p-n junction supplies the current sense signal 304 as shown in FIG. 6(b). The improved resolution is clear.

The above two embodiments clearly demonstrate that any signal that responds exponentially to the laser intensity or the resultant thermal signature can be utilized to produce the sub-diffraction imaging described herein. The possibilities include, but are not limited to:

Chemical reaction rates
Biological growth rates
Electron emission
Transport rates across barriers (chemical barriers, optical barriers in near-field transmission with temperature expansion affecting barrier spacing)
Fluorescent emission rates
Ionization rates While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. An apparatus for producing a sub-diffraction limited image, the apparatus comprising:
   an optical source configured to focus an optical beam onto a target, said optical beam having sufficient optical intensity to induce an exponential signal associated with the target that increases exponentially with regard to power level of the focused optical beam;
   a detection device configured to detect said exponential signal;
   a scanning device configured to scan said focused optical source; and
   a device configured to record said detection of said exponential signal for purposes of producing a sub-diffraction limited image.

2. The apparatus of claim 1, further comprising a display device configured to display at least a portion of the recorded detection.

3. The apparatus of claim 1, wherein the optical source is a laser.

4. The apparatus of claim 1, wherein the exponential signal within the target is thermal radiation.

5. The apparatus of claim 1, wherein the exponential signal is a semiconductor device leakage current.

6. The apparatus of claim 1, wherein the exponential signal comprises at least one of a chemical reaction rate signal, a biological growth rate signal, an electron emission signal, a transport rate signal associated with rate of transport of a material across a barrier, a fluorescent emission rate signal and an ionization rate signal.

7. The apparatus of claim 1, wherein the scanning device comprises at least one of a laser scanning or confocal type microscope.

8. A method for producing a sub-diffraction limited image, the method comprising:
- focusing an optical beam onto a target, said optical beam having sufficient optical intensity to induce an exponential signal associated with the target that increases exponentially with regard to power level of the focused optical beam;
- detecting said exponential signal;
- scanning said focused optical source; and
- recording said detection of said exponential signal for purposes of producing a sub-diffraction limited image.

9. The method of claim 8, further comprising displaying at least a portion of the recorded detection.

10. The method of claim 8, wherein the optical beam is generated by a laser.

11. The method of claim 8, wherein the exponential signal within the target is thermal radiation.

12. The method of claim 8, wherein the exponential signal is a semiconductor device leakage current.

13. The method of claim 8, wherein the exponential signal comprises at least one of a chemical reaction rate signal, a biological growth rate signal, an electron emission signal, a transport rate signal associated with rate of transport of a material across a barrier, a fluorescent emission rate signal and an ionization rate signal.

14. An apparatus for producing a sub-diffraction limited image, the apparatus comprising:
- a first means for focusing an optical beam onto a target, said optical beam having sufficient optical intensity to induce an exponential signal associated with the target that increases exponentially with regard to power level of the focused optical beam;
- a second means for detecting said exponential signal;
- a third means for scanning said focused optical source; and
- a fourth means for recording said detection of said exponential signal for purposes of producing a sub-diffraction limited image.

15. The apparatus of claim 14, further comprising a fifth means for displaying at least a portion of the recorded detection.

16. The apparatus of claim 14, wherein the optical source is a laser.

17. The apparatus of claim 14, wherein the exponential signal within the target is thermal radiation.

18. The apparatus of claim 14, wherein the exponential signal is a semiconductor device leakage current.

19. The apparatus of claim 14, wherein the exponential signal comprises at least one of a chemical reaction rate signal, a biological growth rate signal, an electron emission signal, a transport rate signal associated with rate of transport of a material across a barrier, a fluorescent emission rate signal and an ionization rate signal.

* * * * *